(12) United States Patent
Lim et al.

(10) Patent No.: US 9,892,936 B2
(45) Date of Patent: Feb. 13, 2018

(54) PACKAGED SEMICONDUCTOR DEVICE HAVING LEADFRAME FEATURES PREVENTING DELAMINATION

(71) Applicant: TEXAS INSTRUMENTS INCORPORATED, Dallas, TX (US)

(72) Inventors: Wei Fen Sueann Lim, Melaka (MY); Lee Han Meng@ Eugene Lee, Johor (MY); Anis Fauzi Bin Abdul Aziz, Melaka (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/340,837

(22) Filed: Nov. 1, 2016

(65) Prior Publication Data

US 2017/0053814 A1    Feb. 23, 2017

Related U.S. Application Data

(62) Division of application No. 14/592,011, filed on Jan. 8, 2015, now Pat. No. 9,515,009.

(51) Int. Cl.
*H01L 21/56* (2006.01)
*H01L 21/48* (2006.01)
(Continued)

(52) U.S. Cl.
CPC ........ *H01L 21/561* (2013.01); *H01L 21/4825* (2013.01); *H01L 21/4842* (2013.01); *H01L 21/563* (2013.01); *H01L 21/78* (2013.01); *H01L 23/3114* (2013.01); *H01L 23/49503* (2013.01); *H01L 24/32* (2013.01); *H01L 24/49* (2013.01); *H01L 24/73* (2013.01); *H01L 24/83* (2013.01); *H01L 24/85* (2013.01); *H01L 24/92* (2013.01); *H01L 24/97* (2013.01); *H01L 23/3107* (2013.01); *H01L 23/49541* (2013.01);
(Continued)

(58) Field of Classification Search
CPC ............. H01L 23/495; H01L 23/49503; H01L 21/4825; H01L 23/3114; H01L 23/49568
See application file for complete search history.

(56) References Cited

U.S. PATENT DOCUMENTS

| | | | | |
|---|---|---|---|---|
| 5,647,528 A | * | 7/1997 | Ball | B23K 20/004 228/180.5 |
| 5,673,845 A | * | 10/1997 | Ball | B23K 20/004 228/180.5 |

(Continued)

*Primary Examiner* — Nathan W Ha
(74) *Attorney, Agent, or Firm* — Rose Alyssa Keagy; Charles A. Brill; Frank D. Cimino

(57) ABSTRACT

A semiconductor device has a leadframe with a first (401a) and a parallel second surface, and an assembly pad (410) bordered by two opposing sides, which include a plurality of through-holes (420) from the first to the second pad surface. Another pad side includes one or more elongated windows (421) between the pad surfaces. The second pad surface includes a plurality of grooves. The leadframe further has a plurality of leads (430) with opposite elongated sides castellated by indents (431). Layers (440) of bondable metals are restricted to localized areas surrounding bond spots. A semiconductor chip (450) is attached to the pad and wire-bonded (460) to the bond spots. A package (470) encapsulates the chip, wires, pad, and lead portions, and secures the leadframe into the package by filling the through-holes, windows, grooves, and indents.

5 Claims, 4 Drawing Sheets

(51) Int. Cl.
  *H01L 21/78*    (2006.01)
  *H01L 23/31*    (2006.01)
  *H01L 23/495*   (2006.01)
  *H01L 23/00*    (2006.01)

(52) U.S. Cl.
  CPC .... *H01L 24/48* (2013.01); *H01L 2224/32245* (2013.01); *H01L 2224/48091* (2013.01); *H01L 2224/48245* (2013.01); *H01L 2224/48247* (2013.01); *H01L 2224/48257* (2013.01); *H01L 2224/49052* (2013.01); *H01L 2224/49113* (2013.01); *H01L 2224/49175* (2013.01); *H01L 2224/49433* (2013.01); *H01L 2224/73265* (2013.01); *H01L 2224/8346* (2013.01); *H01L 2224/83424* (2013.01); *H01L 2224/83447* (2013.01); *H01L 2224/85439* (2013.01); *H01L 2224/92247* (2013.01); *H01L 2224/97* (2013.01); *H01L 2924/00014* (2013.01); *H01L 2924/181* (2013.01)

(56) References Cited

U.S. PATENT DOCUMENTS

| | | | |
|---|---|---|---|
| 6,396,130 | B1 | 5/2002 | Crowley et al. |
| 6,987,034 | B1* | 1/2006 | Chiang ............... H01L 21/4821 |
| | | | 257/E23.033 |
| 8,089,145 | B1 | 1/2012 | Kim et al. |
| 9,355,945 | B1* | 5/2016 | Ge ................... H01L 23/49568 |
| 2005/0189627 | A1* | 9/2005 | Ito ....................... H01L 21/4825 |
| | | | 257/666 |
| 2006/0097366 | A1 | 5/2006 | Sirinorakul et al. |
| 2006/0170080 | A1 | 8/2006 | Zuniga-Ortiz et al. |
| 2007/0075815 | A1 | 4/2007 | Lotfi et al. |
| 2008/0073739 | A1 | 3/2008 | Kitamura et al. |
| 2009/0032917 | A1 | 2/2009 | Ito |
| 2009/0250795 | A1 | 10/2009 | Hooper et al. |
| 2011/0074007 | A1 | 3/2011 | Lopez et al. |
| 2012/0080781 | A1 | 4/2012 | Li et al. |
| 2012/0086112 | A1 | 4/2012 | Amaro et al. |
| 2012/0112331 | A1* | 5/2012 | Kuo .................. H01L 23/49524 |
| | | | 257/670 |
| 2013/0256733 | A1 | 10/2013 | Lin et al. |
| 2013/0264694 | A1 | 10/2013 | Kim et al. |
| 2014/0191380 | A1 | 7/2014 | Lee et al. |
| 2014/0361420 | A1 | 12/2014 | Yilmaz et al. |

* cited by examiner

PACKAGED SEMICONDUCTOR DEVICE HAVING LEADFRAME FEATURES PREVENTING DELAMINATION

CROSS-REFERENCE TO RELATED APPLICATION

This divisional application claims priority to and benefit of U.S. patent application Ser. No. 14/592,011, flied on Jan. 8, 2015, the entirety of which is incorporated herein by reference.

FIELD

Embodiments of the invention are related in general to the field of semiconductor devices and processes, and more specifically to the structure and fabrication method of leadframes with mechanical and metallurgical features for preventing delamination of packaged semiconductor devices.

DESCRIPTION OF RELATED ART

Moisture-induced failures of plastic packaged semiconductor devices have been observed and investigated for many years. It is well known that plastic packages made, for instance, by epoxy-based molding compounds can be penetrated by discrete water molecules within a time period of about one day. However, this penetration does not lead to a problematic situation as long as there is good adhesion inside the package between the plastic compound and the device components (semiconductor chip, metallic leadframe, etc.), and the penetrated water molecules cannot accumulate to form films of water on free surfaces.

In contrast, when some interfacial delamination has happened and water films have been able to form, quick rises of temperature may vaporize the water and initiate expansive internal pressures between the components and the package material. The expansive pressure may be high enough to bulge the plastic material at thin spots and eventually cause a crack of the package. As an example, the temperature may rise quickly beyond the water boiling point when the packaged device is heated in order to reflow the device solder balls for attaching the device to a board. In the literature, the phenomenon of local package cracking by steam pressure has been dubbed popcorn effect.

A variety of methods have been tried to enhance adhesion between device components and prevent delamination and cracking. Among the efforts have been chemically purifying the molding compounds; activating metal surfaces, for instance by plasma, just prior to the molding process; enhancing the affinity of leadframe metals to polymeric compounds by oxidizing the base metal or by depositing special metal layers (such as rough tin); coining the leadframes for creating dimples and other three-dimensional surface features and roughness for interlocking the plastic with the metal surfaces. However, the success of all these efforts has only been partial and limited.

SUMMARY

The polymerization process, or molecular cross linking, of thermoset compounds causes a volumetric shrinking of the polymeric material. As a consequence, the polymerized material exerts an inward-directed pressure on bodies enclosed by the thermoset compounds. In plastic encapsulated semiconductor products, this effect causes an inward directed force on the enclosed pad with the assembled semiconductor chip.

Applicants discovered that the volumetric shrinkage of packaging compound and the correlated inward-directed pressure can be exploited to clamp leadframe parts, such as the assembly pad, between portions of the package positioned on opposite sides of the pad. This clamping pressure can thus be utilized to counteract and compensate the expanding pressure of vaporized water.

For plastic encapsulated semiconductor devices with metallic leadframes, applicants solved the problem of package delamination and cracking when they applied the concept of clamping pressure by volumetrically shrinking compounds to the large assembly pad of the package. By forming the pad so that a plurality of opening through-holes and through-windows can be distributed along the perimeter of the pad, the molding compound filling these holes and windows can interconnect package portions on the top and the bottom sides of the pad and thus clamp the portions strongly against the pad. Experience has shown that this clamp force is stronger than the force of expanding water vapor.

It is advantageous to supplement the concept of through-holes and through-windows with additional leadframe features such as ditches, grooves, and indents, which provide locations for anchoring packaging compound the contours of leadframes. In addition, as much of the leadframe base metal surface as possible should be made available for adhesion to packaging compound. It is, therefore, advantageous to restrict any areas of additional metal layers to local spots needed for attaching the wire stitch bonds.

DETAILED DESCRIPTION OF THE PREFERRED EMBODIMENTS

Figure 1:
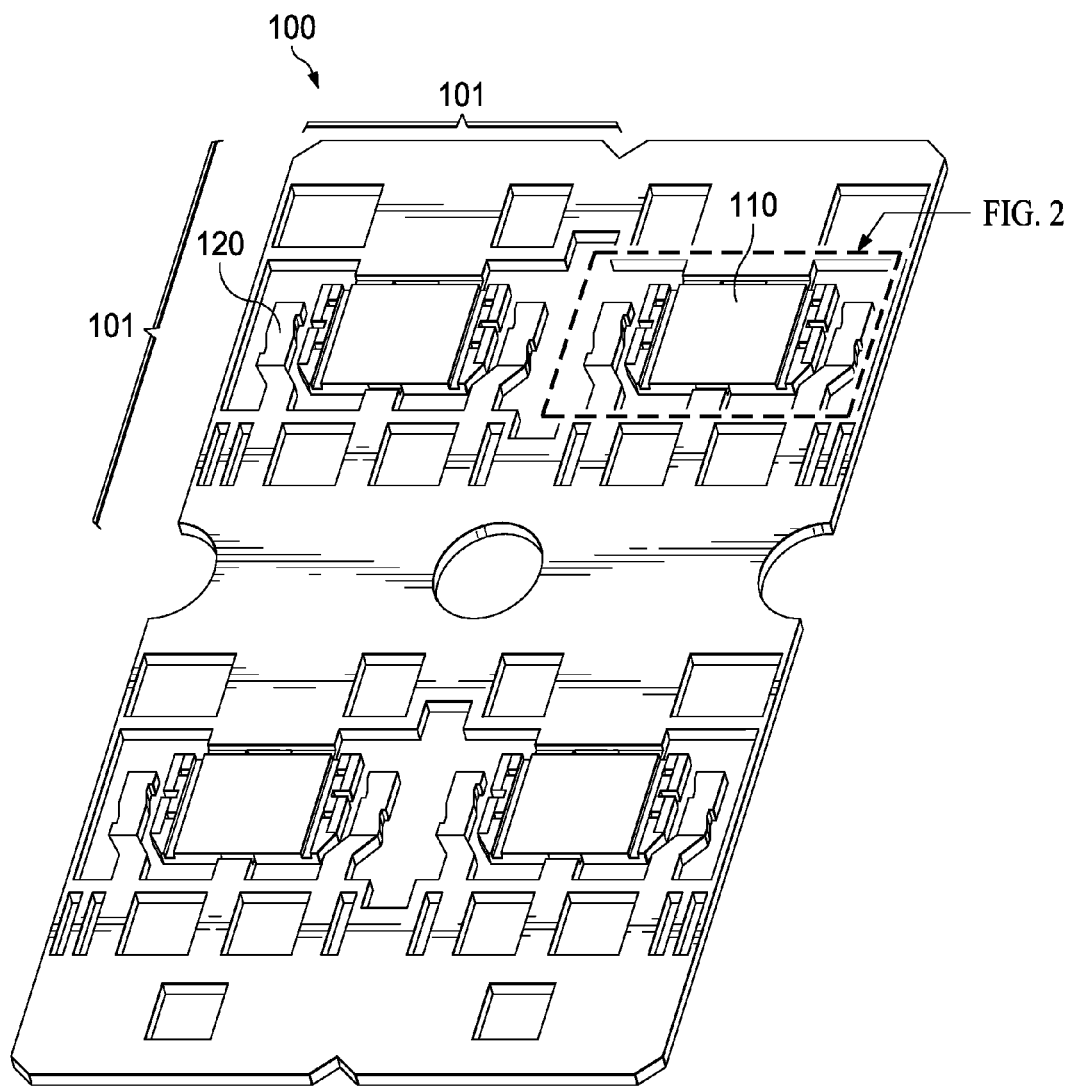
FIG. 1 shows a perspective view of a leadframe strip according to the invention, the strip having a plurality of device sites.

An exemplary embodiment of the invention is a leadframe as illustrated in FIG. 1. The leadframe is based on a strip 100 stamped or etched from a flat sheet of metal selected from a group including copper, copper alloys, aluminum, iron-nickel alloys, and Kovar™. When the metal sheet is made of copper, the preferred thickness of the sheet is between 100 and 300 µm. For some applications, the sheet may be thicker or thinner. As FIG. 1 shows, leadframe strip 100 includes a plurality of device sites 101. Each site includes the components proper for assembling and supporting a semiconductor chip, such as assembly pad 110 and leads 120, as well as rails and connection strips needed for integrating the units into a strip suitable for batch processing.

Figure 2:
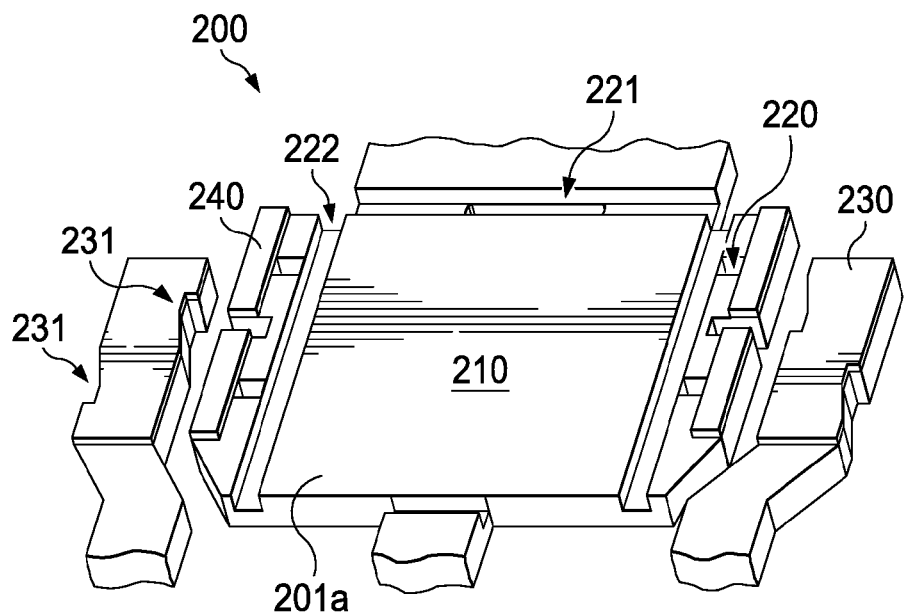
FIG. 2 depicts a perspective top view of a portion of a discrete device site of the leadframe strip in FIG. 1, detailing embodiments of the invention.
Figure 3:
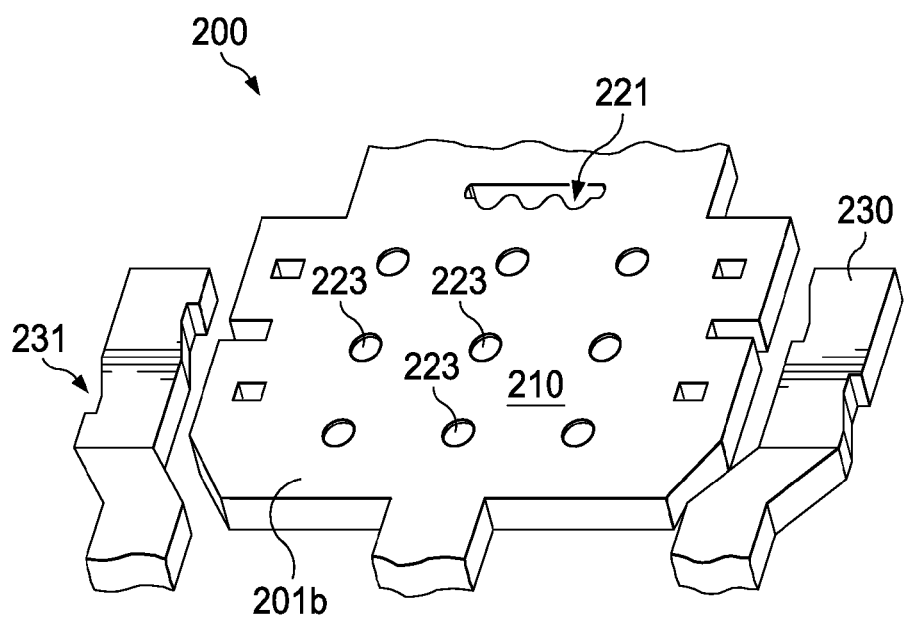
FIG. 3 illustrates a perspective bottom view of the discrete device site of FIG. 2.

FIGS. 2 and 3 display a portion of a discrete unit 200 of exemplary leadframe 100 (portion as marked in FIG. 1); FIG. 2 illustrates the top surface (assembly surface) of the unit, and FIG. 3 depicts the opposite bottom surface of the unit it should be pointed out that herein the top surface is referred to as first surface 201a, and the bottom surface as second surface 201b. As FIG. 2 shows, unit 200 includes a pad 210 for assembling a semiconductor chip. Pad 210 has in first order a rectangular outline with four sides. In other devices, the assembly pad may have the shape of a square or a circle, or any other suitable geometrical configuration. Pad 210 exhibits the base metal of the leadframe (for example, copper) in naturally oxidized mode, free of plated metal layers. For copper leadframes, oxidized copper is characterized by its affinity to adhesion to polymeric encapsulation compounds such as epoxy-based molding compounds.

As FIG. 2 indicates that two opposing sides of pad 210 include a plurality of through-holes or via-holes 220 from the first pad surface 201a to the second pad surface 201b. Through-holes 210 may have square cross section, as in FIG. 2, or may have round or any other cross section. There may be two holes on each side, as shown in the example of FIG. 2, or more holes. During the encapsulation process, through-holes 210 will be filed with packaging compound, such a molding compound; after hardening by polymerization, the filled vies enable strong mechanical locking of the compound portions on the top leadframe side with the compound portions on the bottom leadframe side. Due to the volumetric shrinkage of polymeric compounds, the leadframe is clamped between the compound portions on top and on the bottom of leadframes. Strong clamps inhibit delamination of compound and leadframe.

The exemplary device of FIG. 2 illustrates another pad side, which has an elongated window or hole 221 between the first and the second pad surfaces. There may be one or more elongated windows, and they may have a smooth or a wavy configuration. The elongated windows 221 serve the same purpose as the through-holes 220. After filling the openings with encapsulation compound and volumetric shrinking and hardening the compound during the polymerization process, the leadframe is clamped between the compound portions and thus inhibited from delaminating from the leadframe. In other devices, windows and through-holes may interchange positions, shape, and numbers.

Other contributions to anchoring polymeric packaging compounds into the metallic leadframe are achieved by a plurality of grooves and ditches into the surfaces of the pad, and by indents into the sidewalls of leads. Grooves and ditches can be produced by coining the leadframe metal or by partial etching into the leadframe thickness, so-called half-etching. FIG. 2 shows an example of ditches 222 cut into the top surface 201a of pad 210. In this example, the ditches are parallel to the pad sides; in other devices, the ditches may have other orientations. Viewing the bottom surface 201b of the leadframe in FIG. 3, pad 210 has a plurality of grooves 223 cut into the bottom surface. They are sized and distributed to offer superior mechanical anchoring for the packaging compound into the leadframe pad. In addition, pad 230 exposes the (slightly oxidized) base metal surface free of plated layers of additional metals.

FIGS. 2 and 3 illustrate a plurality of leads 230 of leadframe 230, which have opposite elongated sides. As the figures indicate, these elongated and opposite sides are castellated by indents 231 into the base metal of the leadframe. These indents, therefore, allow the molding compound to grip the leads for mechanical support and thus counteract pressures of delamination and separation.

In FIG. 2, areas 240 of leadframe first surface 201a indicate spots, which have received additional plating by a metal facilitating wire stitch bonding. The preferred choice for the additional metal is silver. However, as FIG. 2 shows, these areas are minimized in order to retain as much of the oxidized leadframe base metal as possible for adhesion to the encapsulation compound. Consequently, these areas surrounding spots intended for stitch bonding are selective and locally restricted.

Figure 4:
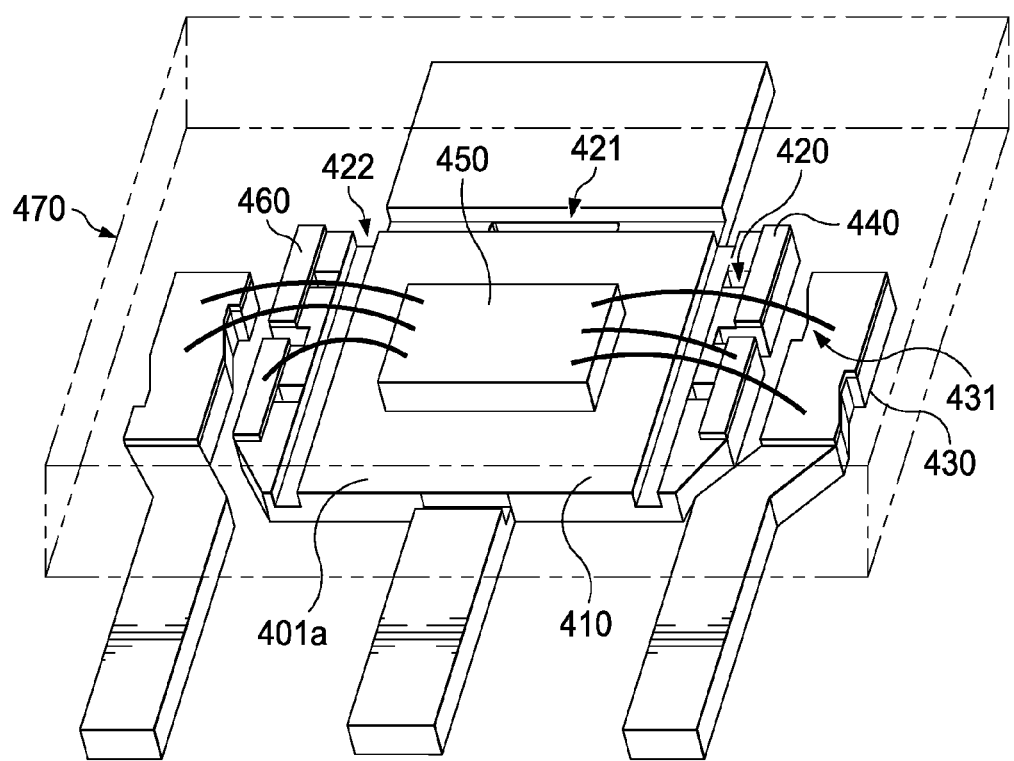
FIG. 4 shows a perspective top view of a discrete device site of the leadframe strip of FIG. 1, with a semiconductor chip assembled on the pad and wire bonded. The outline of the package is depicted in dashed lines.

Another embodiment of the invention is a packaged semiconductor device, which uses a metallic leadframe with features described above. An example of a device with low lead count is illustrated in FIG. 4. The leadframe has a first and a second surface, and an assembly pad 410 bordered by two opposing sides; the first surface is the surface for chip assembly, the opposite surface is the second surface. Each pad side includes a plurality of through-holes 420 from the first to the second pad surface. Pad 410 is further bordered by another side, which includes one or more elongated windows 421 between the pad surfaces. In addition, the first surface of pad 410 has a plurality of ditches 422, which extend certain lengths across the first surface. The opposite second pad surface includes a plurality of grooves. The leadframe further has a plurality of leads 430 with opposite elongated sides; the sides are castellated by indents 431. The leads have layers 440 of bondable metals deposited on the leadframe base metal, but layers 440 are restricted to localized areas surrounding bond spots.

In FIG. 4, a semiconductor chip 450 is attached to pad 410. The terminals of chip 450 are connected by bonding wires 460 to the bondable localized spots 440. Chip 450, wires 460, pad 410, and portions of the leads 430 are encapsulated by a packaging material 470, such as a polymerizable epoxy-based molding compound. During the process of applying the packaging compound—for instance by a transfer molding technique—, through-holes 420, windows 421, indents 431, ditches 422, and the grooves on the second surface of pad 410 are filled with packaging material. After curing and polymerizing the material, the leadframe is securely anchored in the packaging material.

Another embodiment of the invention is a method for fabricating semiconductor devices with leadframes having safeguards against delamination of leadframe and encapsulation material, and against package cracking. Certain steps of the method are depicted in FIGS. 1 through 6. The method starts by providing a leadframe strip as depicted in FIG. 1 by exemplary strip 100, which has a first and a second surface and a plurality of device sites 101. Each site includes an assembly pad 110 bordered by two opposing sides; each side has a plurality of through-holes 220 from the first to the second pad surface. Pad 110 is further bordered by another side, which includes one or more elongated windows 221 between the pad surfaces. In addition, the first surface of pad 210 has a plurality of ditches 222, which extend certain lengths across the first surface. The opposite second pad surface includes a plurality of grooves. The leadframe further has a plurality of leads with opposite elongated sides; the sides are castellated by indents 231. The leads, and in some devices portions of the pad, have layers 240 of bondable metals deposited on the leadframe base metal, but layers 240 are restricted to localized areas surrounding bond spots in order to retain as much surface of oxidized base metal as possible for adhesion toe packaging compound.

In the next process, indicated in FIG. 4, a semiconductor chip 450 is attached to the pad 410 of each leadframe site. Thereafter, the terminals of each chip are connected by bonding wires to the bondable spots of respective leads. In the next process, indicated in FIGS. 4 and 5, a plurality of packages is formed by encapsulating the chip, wires, pad, and certain lead portions of each site in a packaging material. The preferred process is a transfer molding technique, which uses an epoxy-based polymeric compound filed with inorganic filler particles. During the transfer molding process, the packaging compound fills through-holes 420, windows 421, ditches 422, and grooves on the second pad surface, and interlocks with indents 431. After polymerizing and hardening the compound, the leadframe of each site is securely anchored into the package. Since the polymerization process involves a volumetric shrinkage of the packaging compound, the leadframe is actually clamped by the polymerized packaging compound, wherein the clamping force counteracts the expansion force of steaming water and thus prevents delamination of packaging compound and leadframe.

Figure 5:
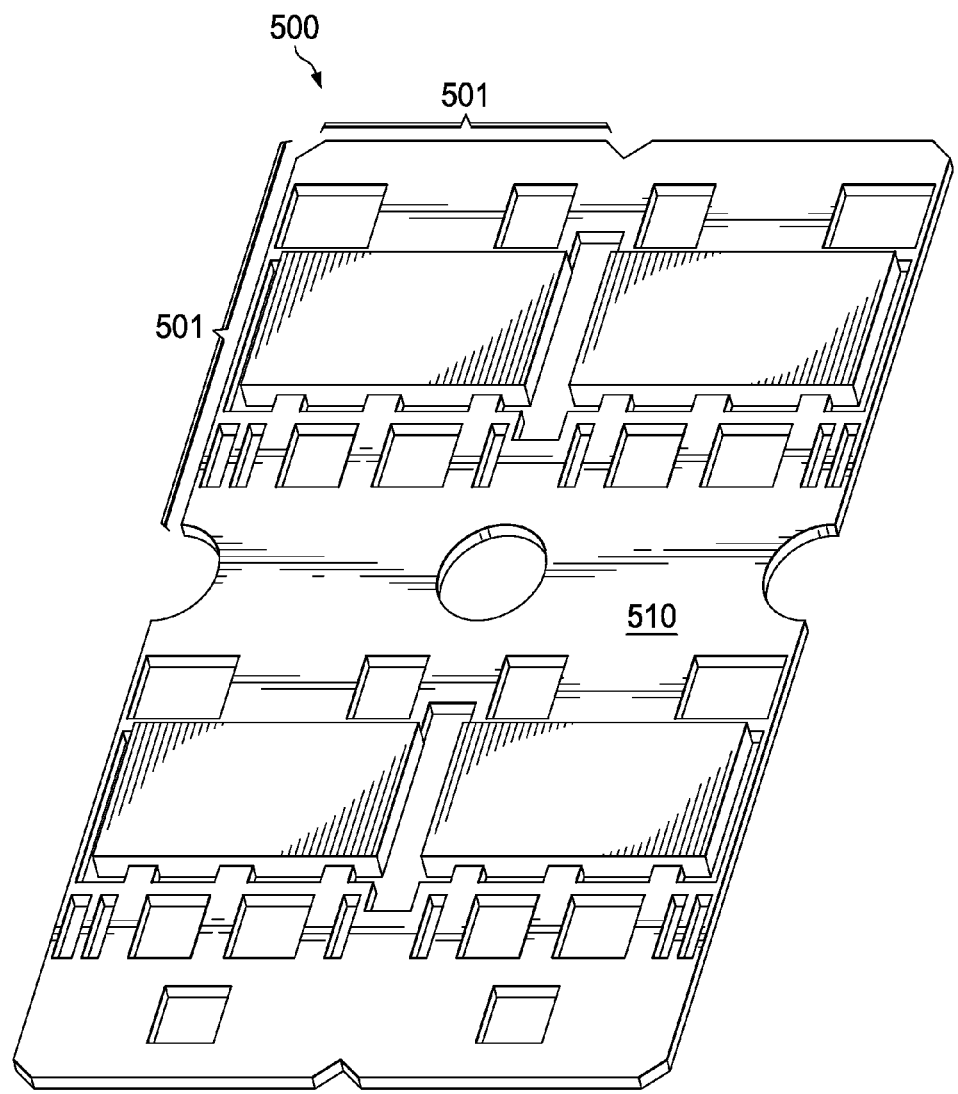
FIG. 5 illustrates a perspective view of the leadframe strip of FIG. 1 after the process of encapsulating the assembled devices in packages and plating the un-encapsulated strip portions with a metal layer.

FIG. 5 shows a leadframe strip 500 after encapsulating the plurality of assembled chips of device sites 501. The packaged devices of the strip are subjected to a heat treatment at about 175° C. for several hours in order to polymerize the plastic compound by cross linking the polymeric molecules. The polymerization process of thermoset compounds causes a volumetric shrinking of the polymeric material. As a consequence, the polymerized material exerts an inward-directed pressure on leadframe portions and assembled chips enclosed by the thermoset compounds, effectively camping the polymerized compound against these parts. The clamping pressure can counteracts and at least partially compensates the expanding pressure of a vaporized water film formed during prolonged storage of the packaged device.

FIG. 5 further indicates that it is economical for certain devices to plate the un-encapsulated portions of metal strip 500 with layers of solderable metal such as tin or a tin alloy.

Figure 6:
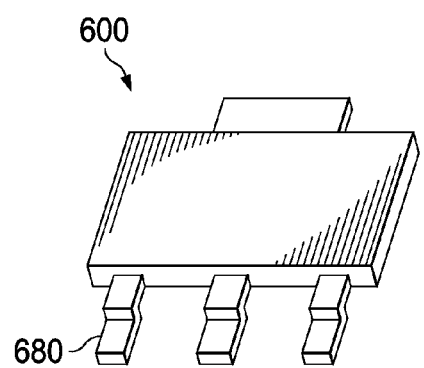
FIG. 6 depicts a perspective view of a packaged and trimmed device with formed leads.

Due to the interlocking of leadframe portions with indents and recesses with the packaging compound, cracking of the hardened (polymerized) compound during the mechanically stressful trim-and-form processes can be avoided. FIG. 6 shows a singulated discrete unit 600 of the plurality of devices, resulting from trimming the leadframe strip of FIG. 5. Finally, the un-encapsulated lead portions 680 are formed. With the plating of solderable metal at the process mentioned in FIG. 5, the formed leads are ready for attachment to boards.

The concept of exploiting the clamping pressure of volumetrically shrinking compounds of a plastic-packaged device to a large pad with its assembled chip has been applied to the construction of the pad so that a plurality of opening through-holes and through-windows are distributed along the perimeter of the pad; the molding compound filing these holes and windows interconnect package portions on the top and the bottom sides of the pad and thus clamp the package portions strongly against the pad. Experience has shown that this clamp force can be stronger than the force of expanding water vapor. Any still missing force difference to prevent delamination and cracking can be provided a combination of features for anchoring and tightly locking the packaging compound with leadframe parts. Examples are indents on opposite sides of leads; ditches in the pad close to the assembled chip; and grooves in the pad surface opposite the assembled chip. In addition, as much of the leadframe base metal surface as possible can be made available for adhesion to the packaging compound. This can be achieved by restricting any areas of additional metal layers to local spots needed for attaching the wire stitch bonds.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to active semiconductor devices with low and high pin counts, such as transistors and integrated circuits, but also to combinations of active and passive components on a leadframe pad.

As another example, the invention applies not only to silicon-based semiconductor devices, but also to devices using gallium arsenide, gallium nitride, silicon germanium, and any other semiconductor material employed in industry.

As another example, the invention applies to leadframe pads, where the pad extends on one side into more than one lead. As yet another example, the invention apples to pads which are offset from the plane of the leadframe.

It is therefore intended that the appended claims encompass any such modifications or embodiments.

We claim:

1. A method for fabricating a semiconductor device comprising:
   providing a leadframe strip having a first and a second surface, and a plurality of device sites, each site patterned into an assembly pad bordered by two opposing sides that include a plurality of through-holes from the first to the second pad surface, and by another side including one or more elongated windows between the pad surfaces;
   attaching semiconductor chips onto the pads;
   connecting each chip to respective leads using bonding wires;
   forming a plurality of packages by encapsulating the chip, wires, pad, and certain lead portions of each site in a packaging material, thereby securing the leadframe of each site into the package by filling the through-holes and windows, leaving other lead portions un-encapsulated;
   trimming the leadframe strip by severing the leads at the surface of the packages and singulating the strip into discrete packages; and
   forming the un-encapsulated portions of the leads.

2. The method of claim 1 further including, before the process of trimming, the process of plating the un-encapsulated portions of the leadframe with at least one solderable metal layer.

3. The method of claim 1 wherein the second pad surface includes a plurality of grooves.

4. The method of claim 1 wherein each device site further has a plurality of leads with opposite elongated sides castellated by indents.

5. The method of claim 1 wherein the first pad surface has layers of bondable metals restricted to localized areas surrounding bond spots.

* * * * *